(12) United States Patent  Kurtz

(10) Patent No.: US 6,577,224 B2
(45) Date of Patent: Jun. 10, 2003

(54) ULTRA HIGH PRESSURE TRANSDUCERS

(75) Inventor: Anthony D. Kurtz, Ridgewood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 09/815,101

(22) Filed: Mar. 22, 2001

(65) Prior Publication Data

US 2002/0135456 A1 Sep. 26, 2002

(51) Int. Cl.[7] ............................................... H01L 10/10
(52) U.S. Cl. ........................................... 338/42; 73/715
(58) Field of Search ............................. 338/42; 73/715, 73/721

(56) References Cited

U.S. PATENT DOCUMENTS

| | | | | |
|---|---|---|---|---|
| 3,325,761 A | * | 6/1967 | McLellan | 338/42 |
| 4,303,903 A | * | 12/1981 | Matsuoka et al. | 338/42 |
| 4,406,993 A | * | 9/1983 | Kurtz | 338/42 |
| 4,586,018 A | * | 4/1986 | Bettman | 338/42 |
| 4,715,231 A | * | 12/1987 | Lee, II et al. | 73/715 |
| 5,212,989 A | * | 5/1993 | Kodama et al. | 73/715 |
| 5,329,819 A | * | 7/1994 | Park et al. | 73/715 |
| 5,581,226 A | * | 12/1996 | Shah | 338/42 |
| 5,867,886 A | * | 2/1999 | Ratell et al. | 73/715 |
| 5,874,679 A | * | 2/1999 | Sokn | 73/721 |
| 5,999,082 A | * | 12/1999 | Kurtz et al. | 338/42 |

* cited by examiner

Primary Examiner—Karl D. Easthom
(74) Attorney, Agent, or Firm—Duane Morris LLP

(57) ABSTRACT

An oil filled pressure transducer of the type employing a metal diaphragm has a diaphragm of a greater thickness than a conventional diaphragm. The thick diaphragm exhibits and accommodates extremely large pressures and deflects to cause a lower pressure to be transmitted to the oil. Because of the large thickness of the metal diaphragm, the diaphragm dissipates a predetermined percentage of the applied pressure, whereas a corresponding fraction of the applied pressure is transmitted to the oil and hence to the silicon sensors. In this manner the diaphragm acts as a step-down transformer where a portion of the force or pressure applied to the diaphragm is transmitted to the pressure sensor. The pressure sensor receives a pressure which is a fraction of the applied pressure and the sensor is compensated to produce an output proportional to the actual pressure as applied to the thick diaphragm.

13 Claims, 1 Drawing Sheet

ULTRA HIGH PRESSURE TRANSDUCERS

This invention relates to pressure transducers and particularly to pressure transducers capable of measuring extremely high pressures.

BACKGROUND OF THE INVENTION

As is well known, pressure transducers generally employ piezoresistive elements, which are disposed on a silicon sensor and which when subject to a force or pressure, exhibit a change in resistance. Such devices have been used with oil, which oil or fluid is employed as a force transmitting medium. In certain applications, the external pressure applied to a diaphragm or transducer can be very large. These devices frequently employ a metal diaphragm as a force collector and a media isolator. The metal diaphragm communicates with a silicon pressure sensor through an oil filled reservoir, which is contained in an internal hollow in the transducer housing. For examples of such prior art devices, reference is made to U.S. Pat. No. 4,406,993, entitled, "Oil Filled Pressure Transducers," issued on Sep. 27, 1983, to Anthony D. Kurtz, the inventor herein, and assigned to Kulite Semiconductor Products, Inc., the assignee herein.

Such pressure transducers have been used in very hostile environments, such as in combustion or diesel engines where the temperatures and pressures can be extremely high. As one knows, the metal isolation diaphragm must be fairly compliant to deflect and to accommodate the increase in oil volume. In these devices the large induced pressure would build up in the oil, which will be transmitted to the silicon sensor. Such devices have operated at pressures of 30,000 psi or greater.

When attempting to operate such transducers at extremely high pressures, such as pressures which approach 75,000 psi or greater, one experiences severe problems in transducer operation. The transducers, when subjected to such huge pressures, experience the rupture of terminal pins which are associated with the header. These pins or contacts are actually pushed out. The transducer cannot hold the oil because the header ruptures due to such large pressure. This becomes a serious problem. Thus, the use of pressure transducers at pressures which are on the order of magnitude of 75,000 psi or higher is extremely questionable, and such devices are subjected to extreme problems, which can render the devices unusable.

Based on the present invention, it has been determined that a metal diaphragm, of the type used in an oil filled transducer, when increased in thickness renders a value where the diaphragm can exhibit and accommodate extremely large pressures and deflect to cause a lower pressure to be transmitted to the oil. Because of the large thickness of the metal diaphragm, the diaphragm will deflect, but a large amount of pressure is dissipated in the diaphragm, whereas a fraction of the applied pressure is transmitted to the oil and hence to the silicon sensors.

DETAILED DESCRIPTION

Figure 1:
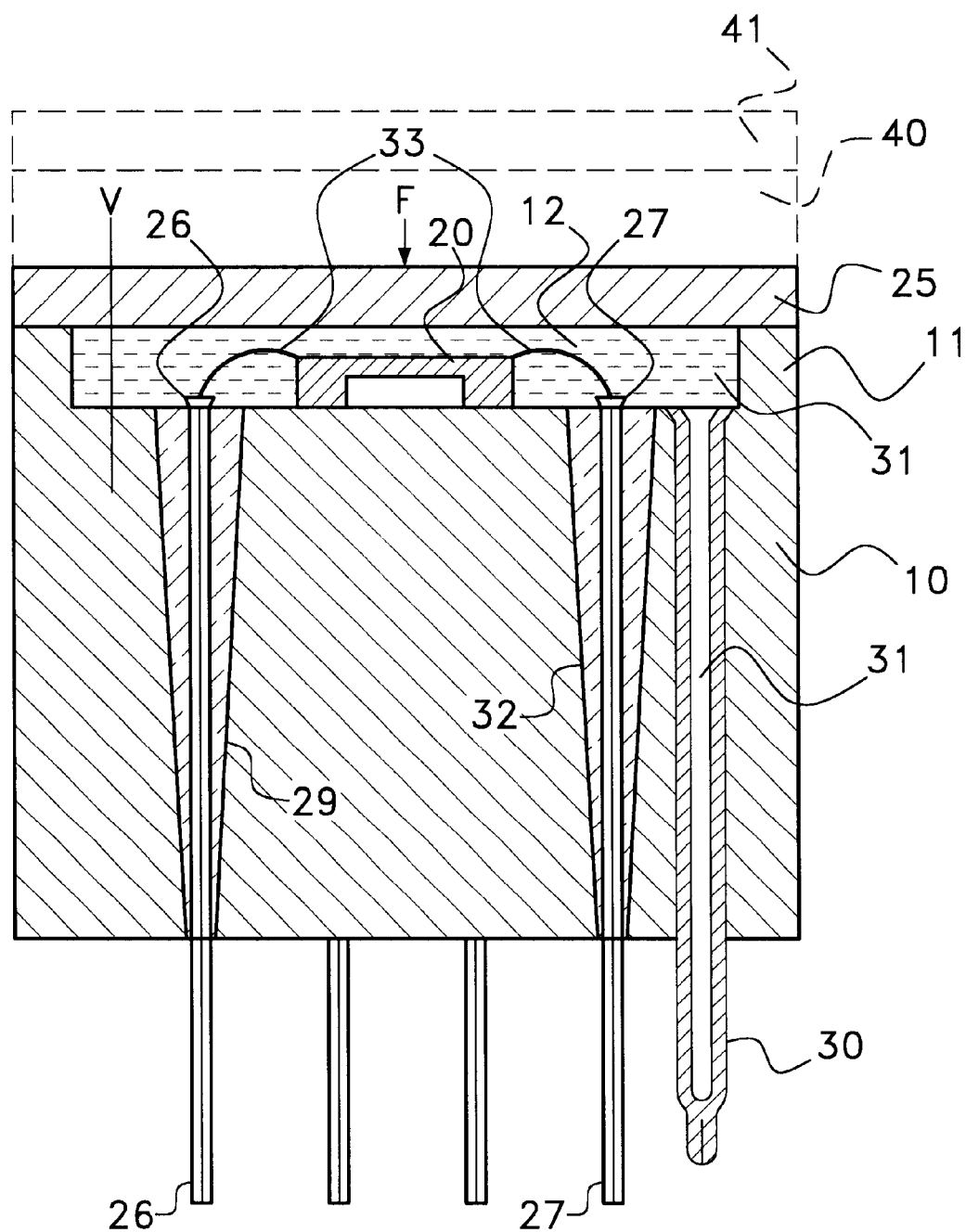
FIG. 1 is the sole FIGURE depicting a side cross sectional view of a pressure transducer according to this invention.

It is known that when silicon pressure diaphragms are used to measure pressure in a relatively hostile environment, it is frequently necessary to isolate the silicon sensor from the pressure media by means of the metal isolation diaphragm. The media pressure is coupled to the silicon sensor by means of the oil, which is located between the isolation diaphragm and the silicon sensor. This technique works very well for moderate pressures and temperatures.

As temperature increases, the oil expands in volume. Unless the metal isolation diaphragm is not sufficiently compliant to deflect enough to accommodate the increase in oil volume, a thermally induced pressure will build up in the oil, which will be transmitted to the silicon sensor. This can cause an error. This problem has been addressed. See, for example, U.S. Pat. No. 5,999,082, issued on Dec. 7, 1999, entitled, "Compensated Oil Filled Pressure Transducers," to Anthony D. Kurtz, et al., the inventor herein, and assigned to Kulite Semiconductor Products, Inc., the assignee herein.

As indicated above, as the pressure increases, one experiences severe problems in utilizing a metal diaphragm. These problems result in the rupture of the diaphragm, the pushing out of pins, the discharge of oil, etc. In operation, a thin diaphragm will respond very well to applied pressure, and transfers almost 100% of the pressure applied to the diaphragm to the oil located beneath the diaphragm. The oil, in turn, transmits the pressure to the sensor. This is proper for low pressure. However, as the pressure gets higher, the above problems ensue.

Now imagine a metal diaphragm which is so thick that it will not deflect. Such a diaphragm, therefore, will transmit no pressure to the oil, and therefore the transducer will not operate as the silicon sensors, which are coupled to the oil, will not respond because the diaphragm is so thick that no pressure could be transmitted. It has been discovered that between the extremely thin diaphragm and the extremely thick diaphragm, there is a diaphragm which is very thick compared to the thin diaphragm but is not so thick as not to deflect. This diaphragm, for example, will transmit a percentage of the applied pressure to the oil. Such a diaphragm, for example, may be 15 mm thick, as compared to, for example, a good, thin conventional diaphragm which is less than 1 mm thick. A 15 mm diaphragm may transmit a percentage such as 50% of the pressure applied to the oil.

Thus, assume one has a transducer which is capable of responding to a pressure of 35,000 psi. If the thickness of the diaphragm is increased so that when a pressure of 75,000 psi is applied to the diaphragm, a pressure of 35,000 psi is applied to the sensor via this oil. In this manner, 50% of the pressure applied to the thick metal diaphragm would be transmitted to the silicon sensor. The electrical analogy is to a step-down transformer. In a step-down transformer, a large voltage applied to the primary winding provides a small voltage at a higher current at the secondary winding. This is the electrical equivalent of the present invention.

In the present invention, the thick metal diaphragm acts as a step-down transformer, whereby a large pressure applied to the thick diaphragm is transmitted to the oil at a lower pressure or at a percentage of the applied pressure. Assume that a pressure of 75,000 psi is applied to a thick diaphragm and the thick diaphragm deflects to cause 35,000 psi to be applied to the oil. The sensor configuration which is coupled to the oil will produce an output voltage corresponding to a pressure of 35,000 psi. However, it is known that the actual pressure applied to the metal diaphragm is 75,000 psi because the output of the transducer is 35,000 psi. The diaphragm, therefore, basically provides a step-down of 2:1. In this manner, the diaphragm will do this for any applied pressure. For example, if the pressure now is 50,000 psi, the oil will receive a pressure corresponding to 25,000 psi, which will cause the silicon bridge to produce an output voltage corresponding to 25,000 psi. Because the diaphragm steps the pressure down, one immediately understands that the applied pressure to the diaphragm is, in fact, 50,000 psi or twice the out of the sensor. It is therefore understood that increasing the thickness of the diaphragm enables the metal diaphragm to act similar and analogous to a step-down transformer.

Referring to FIG. 1, there is shown a cross sectional view of the pressure transducer. The transducer is basically cylindrical, with a circular top and bottom, although other configurations can be used as well. Essentially the pressure transducer shown in FIG. 1 is an oil filled transducer. FIG. 1 is the same FIGURE shown in U.S. Pat. No. 4,406,993, entitled, "Oil Filled Pressure Transducers" issued on Sep. 27, 1983 to Anthony D. Kurtz, the inventor herein, and assigned to Kulite Semiconductor Products, Inc., the assignee herein. Essentially, as seen in FIG. 1, the pressure transducer is contained within a metal housing or header 10. The header 10 has a top surface which is surrounded by a lip or peripheral flange 11. A pressure sensor 20 is located on a top surface of the header 10 in a relatively central position as surrounded by the lip of flange 11. This pressure sensor comprises a semiconductor diaphragm of an inverted u-shaped configuration having located on a surface, and within the active area, a piezoresistive bridge array. Such arrays are well known in the art and see for example, U.S. Pat. No. 3,654,579 entitled, "Electromechanical Transducers and Housings", issued on Apr. 4, 1972 to Anthony D. Kurtz et al. and assigned to the assignee herein. This patent depicts various structures of bridge circuits.

Essentially, while the pressure transducer shown as FIG. 1 is of a particular configuration, the main aspect of the transducer to be described herein is the metal diaphragm 25. The diaphragm 25 may be fabricated from stainless steel or some other material and is secured to the metal header 10 by means of a weld or other metal-to-metal seal. While the metal diaphragm is shown as a certain thickness, it is of course understood that the dimensions depicted in FIG. 1 are of no particular consequence and are not drawn to scale. Such transducers, as for example those shown in the prior art, experience huge forces and in fact the forces are so large, that there can be destruction of the terminal pins and various other problems.

In U.S. Pat. No. 4,406,993, an oil filled pressure transducer is described where the leads as 33 are directed to the terminal pins 26 and 27 which are located in tapered apertures as 29 and 32. The tapered apertures have a larger diameter at the top surface of the header and a smaller diameter at the bottom surface of the header. The terminal pins, such as 26 and 27 are inserted coaxial with the pin secured in place by means of a glass bond. Tube 30 serves as an access port for introducing oil or fluid 31 into the recess 12. Once the oil is inserted into the recess 12, the tube 30 is crimped or closed and maintains the oil within the recess 12. When a pressure or force is impressed upon the metal diaphragm 25, the oil located in the recess transmits the force to the pressure sensor 20. As indicated, in many operating environments great pressures occur and these pressures are of such a magnitude, that they can serve to force the pins 26 and 27 out of their headers. Such force can also push the oil port or tube 30 out of the header.

The above noted 993 patent shows a way of avoiding this problem.

As is indicated above as the temperature increases, the oil expands in volume. Unless the metal isolation diaphragm is not sufficiently compliant to deflect enough to accommodate the increase in oil volume, a thermal induced pressure will build up in the oil which will be transmitted to the silicon sensor. This effect gives rise to an error in the pressure measurement. For this reason the metal diaphragm is made as compliant as possible and the oil volume is reduced as much as possible. Reference is again made to U.S. Pat. No. 5,999,082, entitled, "Compensated Oil Filled Pressure Transducers" for a complete description of this operation.

In the present invention one may increase the thickness of the metal diaphragm 25. Referring to FIG. 1, there is shown dashed lines 40 and 41 indicating that the thickness of the metal diaphragm is substantially increased, as for example, five to fifteen or more times in thickness. It has been discovered that the thickness in the diaphragm causes the metal diaphragm to act as a step-down transformer, whereby a large pressure applied to the thick diaphragm is transmitted to the oil at a lower pressure or at a percentage of the applied pressure. In this manner even though the diaphragm is thick, it will still transmit a force to the oil to cause the sensor configuration to produce an output voltage corresponding to the applied pressure. As indicated above, for example if the actual pressure applied to the metal diaphragm is 75,000 psi, the metal diaphragm will cause 35,000 psi to be applied to the transducer and will in fact dissipate 35,000 psi. The output of the transducer would have a reading of 35,000 pounds. In this manner the diaphragm basically provides a step-down of two to one. If the applied pressure is now 50,000 psi the oil will receive a pressure corresponding to 25,000 psi, which will cause the silicon bridge mounted on the transducer 20 to produce an output voltage corresponding to 25,000 psi. The voltage is always 50% or one half of the pressure applied to the diaphragm.

Therefore, as one can ascertain from the above discussion, utilizing a metal diaphragm in conjunction with an oil filled transducer and increasing the thickness of the diaphragm enables operation at extremely high pressures. In this manner if the diaphragm were increased in thickness as indicated by dashed lines 40 and 41 of FIG. 2, the diaphragm would not couple the total force to the oil. The diaphragm basically behaves as a step-down transformer and as indicated, if the pressure applied to the diaphragm is X, the oil receives a pressure corresponding to X divided by N, where N is a positive integer greater than one. In the above example, if the pressure applied to the diaphragm is 50,000 psi, the oil would receive a pressure corresponding to 25,000 psi which will cause a silicon bridge to produce an output voltage corresponding to 25,000 psi.

Therefore, the nature of the present invention is to increase the thickness of the metal diaphragm to a point where a predetermined percentage of the applied force is dissipated in the diaphragm with the remaining force being coupled to the oil according to a given step-down ratio as a function of the thickness of the diaphragm.

While the above noted example consisted of a diaphragm of a certain configuration, it is also understood that oil filled pressure transducers can be of different configurations employing metal diaphragms. Therefore, it is readily understood that the above descriptions are, by way of example only, and one skilled in the art can conceive of various embodiments which will be anticipated by the breadth of the scope of the enclosed claims.

What is claimed:

1. A fluid filled transducer for measuring pressures greater than 50,000 psi, having a housing with an internal hollow containing a pressure transducer and said hollow filled with a fluid medium and having a metal diaphragm covering said hollow and fluid, said metal diaphragm operative to receive an applied force for transmission to said fluid medium and therefore to said transducer, the improvement therewith of:

said metal diaphragm being of a thickness in the range of 5–15 times greater than a compliant diaphragm thickness for a known pressure, wherein said greater thickness is operable to dissipate a at least half of said applied force thereby indicating a lower force applied to said pressure transducer.

2. The transducer according to claim 1 wherein said fluid is oil.

3. The transducer according to claim 1 wherein said diaphragm is stainless steel.

4. A pressure transducer for a given high pressure range operation, comprising:

a housing having an internal hollow with a top opening and a pressure sensor mounted in said hollow operative to provide an output according to a received pressure, a pressure transmitting fluid located in said hollow and covering said sensor, a metal diaphragm covering said top opening of said housing and selected to have a thickness in the range of 5–15 times greater than a compliant diaphragm thickness used at said given high pressure range operation, wherein said greater diaphragm is operative to at least half of an applied high pressure thereto and to transmit to said sensor in said fluid a corresponding remaining fraction of said applied pressure.

5. The pressure transducer according to claim 4 wherein said fluid is oil.

6. The pressure transducer according to claim 4 wherein said sensor is a piezoresistive sensor.

7. The pressure transducer according to claim 4 wherein said pressure range is between 30,000 to 100,000 psi.

8. The pressure transducer according to claim 4 wherein said thickness of said diaphragm is at least ten times thicker than said complaint diaphragm.

9. The pressure transducer according to claim 4 wherein said housing and diaphragm are fabricated from stainless steel.

10. A method for measuring a high-pressure applied to a fluid filled transducer having a housing with an internal hollow containing a pressure transducer therein, said hollow further filled with a fluid medium and having a metal diaphragm having thickness significantly greater than that of a substantially compliant diaphragm for a known pressure covering said hollow and fluid, comprising the steps of:

applying said high pressure force to said metal diaphragm, dissipating a at least one half of said applied force through said greater diaphragm thickness; and measuring a remaining pressure at said pressure transducer.

11. The method according to claim 10, wherein said greater diaphragm thickness is in the range of 5–15 times that of a compliant diaphragm.

12. The method according to claim 10 wherein said fluid is oil.

13. The method according to claim 10, wherein said transducer is a piezoresistive sensor.

* * * * *